United States Patent [19]
Zushi et al.

[11] Patent Number: 4,837,663
[45] Date of Patent: Jun. 6, 1989

[54] ELECTRONIC APPARATUS COOLING SYSTEM

[75] Inventors: Shizuo Zushi; Mitsuo Miyamoto; Hiroshi Gou; Fumiyuki Kobayashi, all of Kanagawa; Tetsuo Ogata, Tokyo, all of Japan

[73] Assignee: Hitachi, Ltd., Tokyo, Japan

[21] Appl. No.: 145,473

[22] Filed: Jan. 19, 1988

[30] Foreign Application Priority Data
Jan. 21, 1987 [JP] Japan .................................. 62-11889

[51] Int. Cl.⁴ ........................... H02B 1/00; H05K 7/20
[52] U.S. Cl. ................................................ 361/384
[58] Field of Search ................ 361/381, 382, 383, 384

[56] References Cited
U.S. PATENT DOCUMENTS 3,198,991 8/1965 Barnett ................................ 361/384
4,315,300 2/1982 Parmerlee et al. ................. 361/384

Primary Examiner—Roy N. Envall, Jr.
Attorney, Agent, or Firm—Fay, Sharpe, Beall, Fagan, Minnich & McKee

[57] ABSTRACT

A cooling system for an electronic apparatus comprises a plurality of mother boards each having a circuit board to be cooled, a blower for causing an air flow from one of the mother boards to the other, and a draft duct for directing the air flow between the mother boards.

The draft duct includes an inlet for dividing the air flow into a plurality of partial flows, a partition for changing an air flow direction of the partial flows into some other directions, and an outlet for intermixing the partial flows.

11 Claims, 3 Drawing Sheets

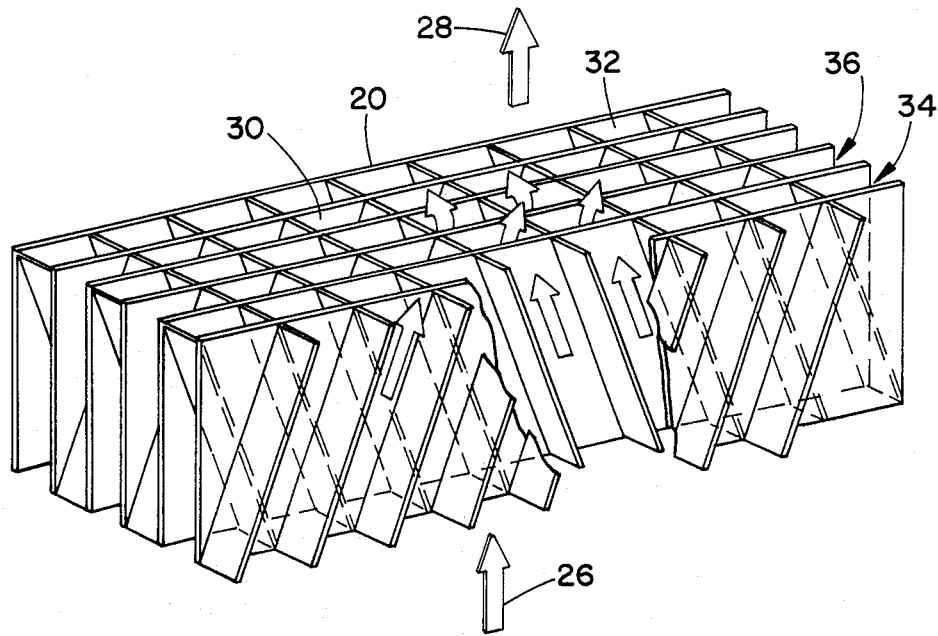
F I G. 2
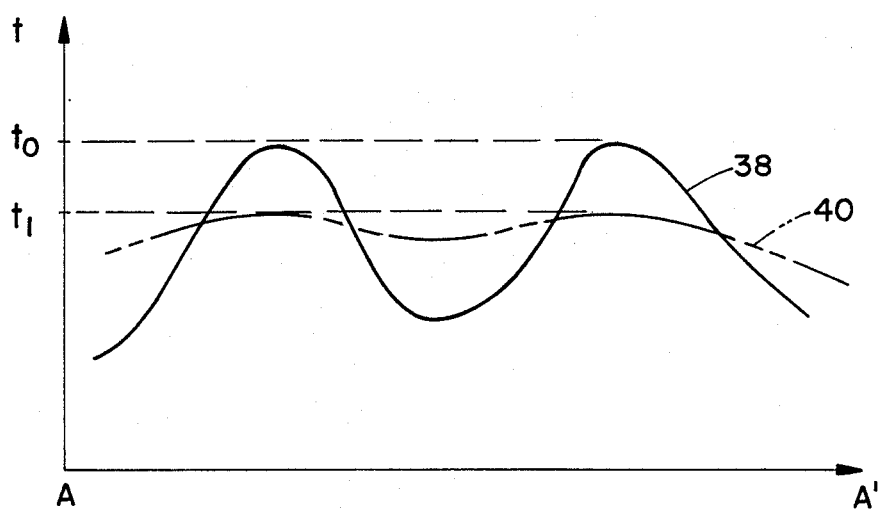
F I G. 3

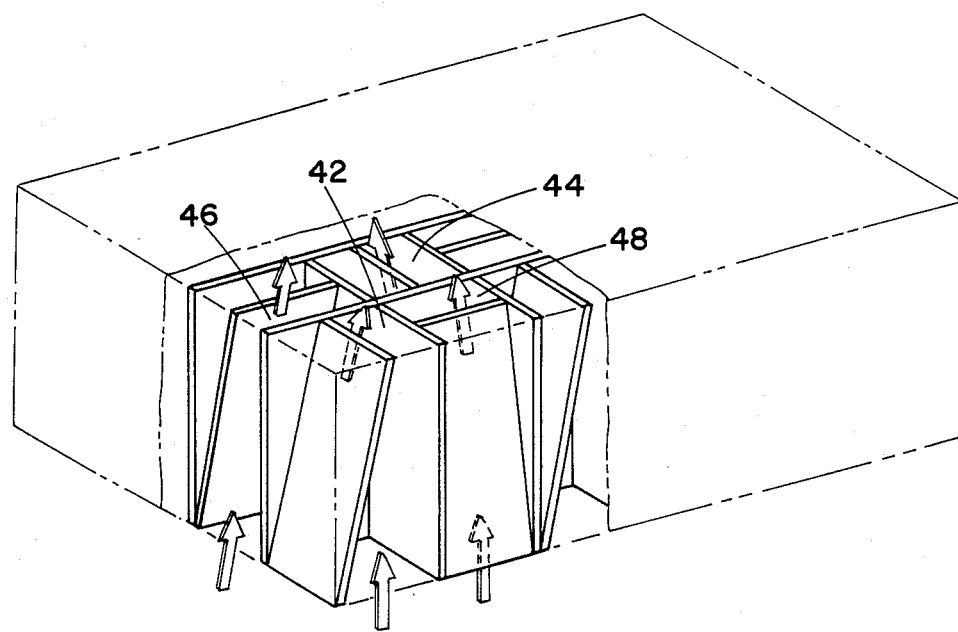
F I G. 4

ELECTRONIC APPARATUS COOLING SYSTEM

BACKGROUND OF THE INVENTION

This invention relates to a cooling system for an electronic apparatus having heat-generating electronic components such as semiconductors, packaged in the apparatus, and more particularly to a cooling system which will be suitable for forced air cooling of such electronic apparatus.

In order to improve a packaging density, electronic apparatus having a large number of electronic components, such as semiconductor devices packaged therein, have generally included a construction wherein mother boards having a plurality of circuit boards to which the semiconductors and the like are attached, are stacked in a vertical direction and fitted to a rack or the like. In such an apparatus, the printed circuit boards of an upper stage mother board may not be cooled sufficiently if cooling wind is sent by only a blower disposed at the lowermost portion of the mounting rack.

In accordance with conventional cooling systems, a blower or blowers are often disposed at the upper portion, too, or each mother board is divided into a plurality of zones and a blower is disposed for each of these zones.

The problem with such conventional systems is that the cost of production will naturally increase with the increase of the number of blowers disposed and the packaging density will drop unavoidable.

Japanese Utility Model Laid-Open No. 162997/1980 proposes the arrangement wherein a heat diffusion plate made of a highly heat-conductive material on which a large number of air vent holes bored is interposed between the upper and lower mother boards. According to this prior art device, the heat of the cooling wind which is heated by the electronic components of a lower stage mother board is diffused by the thermal conduction effect of the heat diffusion plate while the wind passes therethrough and is radiated outside the mounting rack. Therefore, the prior art device can reduce the temperature rise of the cooling wind heated by the lower stage mother board and can send the cooling wind to the upper stage mother board.

In accordance with the prior art technique described above, there is a limit to the effect of making uniform the temperature distribution of the cooling wind while it passes through the diffusion plate. Namely, when the cooling wind from the blower is heated partially to certain extents by part of electronic components having a large exothermic quantity on the lower stage mother board, the cooling wind of this portion is sent to the upper stage mother board through the heat diffusion plate while keeping a higher temperature than the cooling wind of other portions. Therefore, the cooling effect on the electronic temperature is absorbed on the first device cooled, becomes lower than on the other portions of the upper stage mother board, and if the electronic components having a higher exothermic quantity are packaged together at this portion, then the temperature may even rise, contrary to the intended purpose of the system.

Current cooling technology needs require an improved cooling system that overcomes these problems and others, to provide a cooling system that has a minimal number of blowers, that increases the packaging density and which has the capability to send cooling wind to a post-stage by making a temperature distribution of the cooling wind substantially uniform.

SUMMARY OF THE INVENTION

An object of this invention is to provide a cooling system which can send cooling wind to a post stage by making a temperature distribution of the wind substantially uniform.

An object of this invention is to provide a cooling system which can reduce the number of the blowers.

Another object of the invention is to provide a cooling system which can increase the packaging density.

According to the invention, a cooling system for an electronic apparatus comprises a plurality of mother boards each having a circuit board to be cooled, a blower for causing an air flow from one of the mother boards to the other, and a draft duct disposed into the air flow intermediate the mother boards.

The draft duct includes an inlet for dividing the air flow into a plurality of partial flows, a partition for changing an air flow direction of the partial flows into some other directions, and an outlet for intermixing the partial flows as they exhaust from the duct. The temperature rise of the flow which passes through the pre-stage mother board differs from portion to portion owing to non-uniformity of exothermic quantity of the electronic components of the mother board and to the nonuniformity of the cooling wind quantity inside the mother board. Therefore, high temperature portions and low temperature portions develop. The air flow having such a non-uniform temperature distribution enters the draft duct disposed between the pre-stage mother board and the post-stage mother board.

Flows passing through the draft duct are mixed with one another, change into the cooling wind having a uniform temperature distribution and enter the post-stage mother board. Accordingly, each component of the post-stage mother board is cooled uniformly.

BRIEF DESCRIPTION OF THE DRAWINGS

The invention may take physical form in certain parts and arrangements of parts which will be described in detail in this specification and illustrated in the accompanying drawings which form a part hereof and wherein:

FIG. 2 is a perspective view showing a particular structural example of the draft duct used in FIG. 1;

FIG. 3 is a diagram showing a comparison of the temperature distribution of the cooling wind between the case where the draft duct exists and that where it does not; and, FIG. 4 is a schematic structural view of another embodiment of the present invention.

DESCRIPTION OF THE PREFERRED EMBODIMENTS

Figure 1:
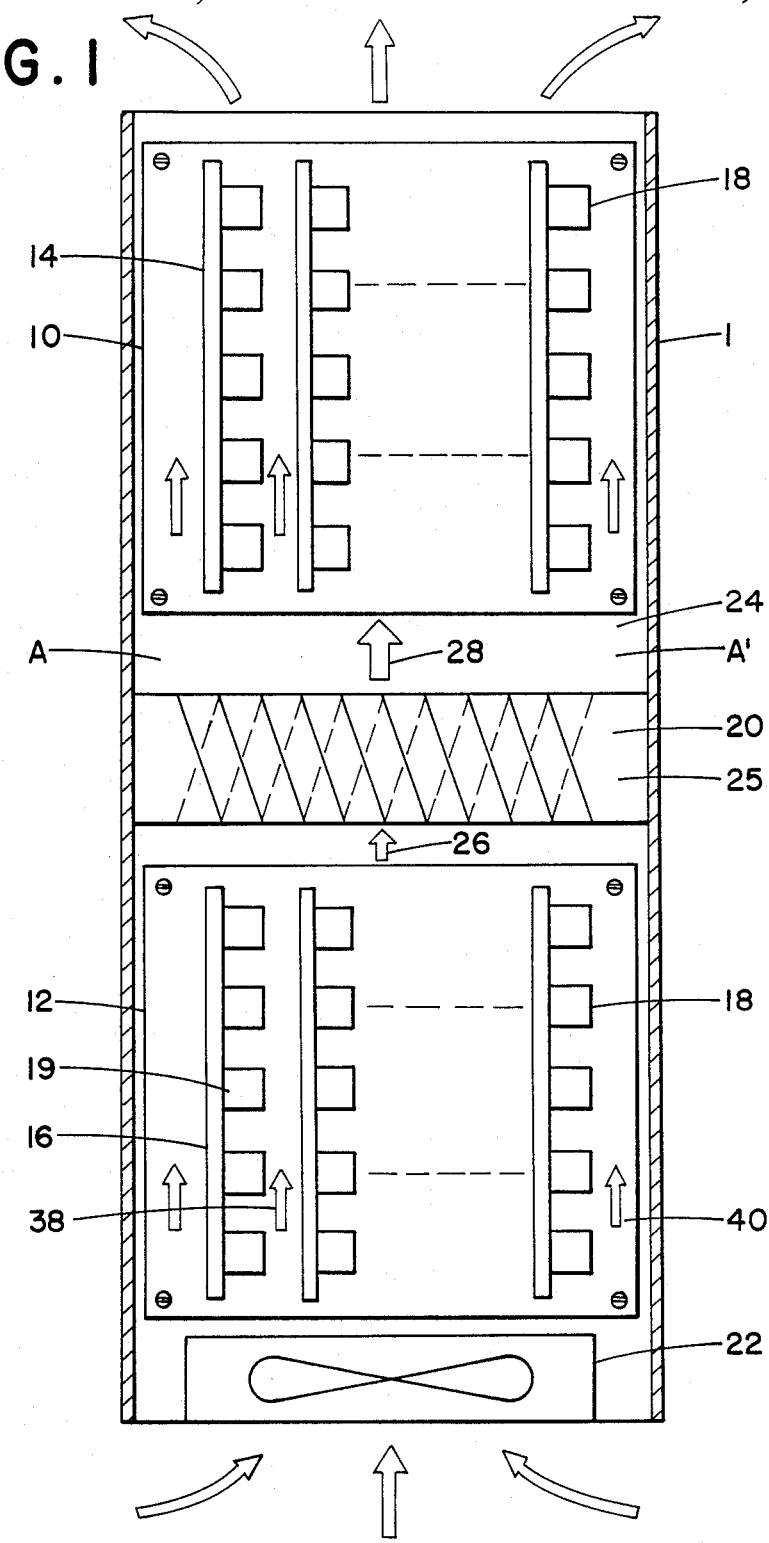
FIG. 1 is a schematic structural view of one embodiment of the present invention.

FIG. 1 is a schematic structural view of one embodiment of the present invention and shows the case where a pre-stage mother board 12 and a post-stage mother board 10 are stacked vertically. A plurality of printed circuit boards 14, 16 to which a large number of heat-generating semiconductor devices 18, 19, are packaged are fitted to each of upper and lower stage mother boards 10 and 12, respectively. For purposes of example, the semiconductor device 18 generates a higher temperature than that of the semiconductor device 19.

These mother boards are mounted to a rack 1. A blower 22 for forced air cooling of the devices 18, 19 on both mother boards is disposed at the lowermost portion of this mounting rack 1. A draft duct 20 which consists of an aggregate of a large number of thin ducts and constitutes the gist of the present invention is disposed between the prestage mother board 12 and the upper stage mother board 10. Chambers 24 and 25 are disposed between the draft duct 20 and the mother boards 10 and 12, respectively.

The blower 22 causes an air flow from the mother board 12 to 10. The air flow from the blower 22 is divided and goes through between circuit boards of the pre-stage mother board 12. The temperature of a flow 40 is increased more than that of a flow 38 because of the higher temperature of the semiconductor device 18. The air flow 26 from the pre-stage mother board 12 has a non-uniform temperature distribution consisting of high temperature portion and low temperature portion. The high temperature portion is caused by the flow 40. The air flow 26 rises past mother board 12 and goes through the draft duct 20.

FIG. 2 shows a more detailed structural example of the draft duct 20. In FIG. 2, a large number of thin ducts 30 constituting the draft duct 20 are divided into groups 34 which are inclined to the left with respect to the sheet of drawing and groups 36 which are inclined to the right, and these groups are disposed for causing alternately divergent air flows.

The air flow 26 is subdivided by a large number of thin ducts 30 forming the draft duct 20. The flow 26 enters each corresponding duct 30 from its inlet and leaves it from its outlet. Here, since the thin ducts 30 are divided into the groups 34 which are inclined to the left and those 36 inclined to the right, the cooling wind flows to the left in the thin duct groups 34, and on the contrary to the right in the thin main duct groups 36. Moreover, this state occurs alternately. As a result, even if the high temperature portions and the low temperature portions exist in the cooling wind passing through the lower stage mother board 12, the portions of the cooling wind are mixed in the chamber 24 after the draft duct 20, and changed into a cooling wind having a substantially uniform temperature distribution, which is then sent to the upper stage mother board 10.

FIG. 3 shows a comparison of the temperature distribution of the cooling wind entering the upper stage mother board 10 in the A—A' section of FIG. 1 between the case where the draft duct 20 exists and the case where it does not. Reference numeral 38 represents the case where the draft duct 20 does not exist. In this case, the temperature distribution of the cooling wind in the A—A' section shows a great difference between the high temperature portions and the low temperature portions due to non-uniformity of the exothermic quantity of the semiconductors such as semiconductors 18 and 19 on the lower stage mother board 12 or due to non-uniformity of the cooling wind quantity inside the lower stage mother board 12. Reference numeral 40 represents the case where the draft duct 20 is disposed in the apparatus. In this case, the high temperature portions and the low temperature portions are mixed and the temperature is averaged. Therefore, the temperature distribution of the cooling wind in the A—A' section becomes uniform and the highest temperature can be lowered from $t_0$ to $t_1$.

FIG. 2 shows the embodiment where a large number of thin ducts 30 are divided into the groups 34 inclined to the left and the groups 36 inclined to the right. Depending upon the temperature distribution of the cooling wind passing through the lower stage mother board, however, the thin ducts 30 may be divided into those groups which are inclined forwardly with respect to the sheet of drawing and those inclined rearwardly.

FIG. 4 shows another embodiment of the draft duct where a large number of thin ducts are combinations of the groups inclined to the right 42 and left 44 with the groups inclined forward 46 and rearward 48. Furthermore, the present invention can be applied to the case where a plurality of mother boards are aligned in a transverse directions.

As will be obvious from the description given above, when a mounting rack comprising a plurality of mother boards which are stacked vertically is forcedly cooled by air, the present invention can make uniform a non-uniform temperature distribution of high temperature portions and low temperature portions even if this non-uniformity exists in the cooling wind passing through the pre-stage mother board and can send the cooling wind having a uniform temperature distribution to the post-stage mother board.

The invention has been described with reference to the preferred embodiment. Obviously, modifications and alterations will occur to others upon reading and understanding the preceding specification. It is intended that the invention be construed as including all such alterations and modifications insofar as they come within the scope of the appended claims or the equivalents thereof.

Having thus described, the preferred embodiment, the invention is now claimed to be:

1. A cooling system for an electronic apparatus comprising:
   a plurality of mother boards having circuit boards to be cooled;
   a blower for causing an air flow from a one mother board to an other mother board; and,
   a draft duct disposed intermediate the mother boards and having means for dividing the air flow into a plurality of partial flows, means for changing an air flow direction of the partial flows, and means for intermixing the partial flow wherein the intermixed partial flows have a substantially uniform temperature distribution for uniform cooling of the mother boards.

2. The system of claim 1 wherein the changing means includes first inclining means for inclining the direction of some partial flows to one direction and second inclining means for inclining the direction of the other partial flows to an opposed direction.

3. The system of claim 2 wherein the changing means including means for placing the first inclining means and the second inclining means alternately.

4. The system of claim 1 wherein the changing means includes first inclining means for inclining the flow of a first some of the partial flows to a first direction, second inclining means for inclining the flow of a second some of the partial flows to a second direction, third inclining means for inclining the flow of a third some of the partial flows to a third direction, and fourth inclining means for inclining the flow of a fourth some of the partial flows to a fourth direction, the partial flows being directed to cross in a generally vertical direction.

5. The system of claim 1 wherein the system further comprises a chamber for intermixed gathering of the partial flows from the draft duct, said chamber being intermediate the draft duct and a mother board.

6. The system of claim 1 wherein the system further comprises means for placing the blower at one end of the mother boards opposite to the draft duct.

7. The system of claim 5 wherein the system further comprises an other chamber intermediate in other mother board and the draft duct.

8. The system of claim 7 wherein the chambers are disposed oppositely of the draft duct.

9. The system of claim 7 wherein the mother board includes means for placing the circuit board generally parallel to the direction of the air flow.

10. A cooling method for a plurality of mother boards generally vertically stacked in a rack, having circuit boards to be cooled, the method comprising the steps of:

causing an air flow from a one of the mother boards to an other;

dividing the air flow from the one of the mother boards into a plurality of partial flows;

changing direction of the partial flows into generally divergent directions;

intermixed gathering of the divided partial flows; and, directing the gathered partial flows to the other of the mother boards.

11. The cooling method of claim 10 wherein the changing step includes the steps of changing the direction of some partial flows into a direction inclined to first direction, and changing the direction of the other partial flows into a direction inclined to an opposed direction of the first direction.

* * * * *

UNITED STATES PATENT AND TRADEMARK OFFICE
CERTIFICATE OF CORRECTION

PATENT NO. : 4,837,663

DATED : June 6, 1989

INVENTOR(S) : Shizuo Zushi, et al.

It is certified that error appears in the above-identified patent and that said Letters Patent is hereby corrected as shown below:

Claim 1, column 4, line 45, delete "flow" and insert therefor --flows--.

Claim 7, column 5, line 7, delete "in" and insert therefor --an--.

Signed and Sealed this

Second Day of April, 1991

Attest:

HARRY F. MANBECK, JR.

*Attesting Officer*  *Commissioner of Patents and Trademarks*